(12) United States Patent
Zhu et al.

(10) Patent No.: US 7,528,027 B1
(45) Date of Patent: May 5, 2009

(54) STRUCTURE AND METHOD FOR MANUFACTURING DEVICE WITH ULTRA THIN SOI AT THE TIP OF A V-SHAPE CHANNEL

(75) Inventors: Huilong Zhu, Poughkeepsie, NY (US); Mahender Kumar, Fishkill, NY (US); Dan M. Mocuta, LaGrangeville, NY (US); Ravikumar Ramachandran, Pleasantville, NY (US); Wenjuan Zhu, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/054,727

(22) Filed: Mar. 25, 2008

(51) Int. Cl.
*H01L 21/336* (2006.01)

(52) U.S. Cl. ............... 438/197; 438/149; 438/151; 438/158; 438/199; 438/264; 438/268; 257/209; 257/255; 257/347; 257/365; 257/E21.249

(58) Field of Classification Search ............... 438/183, 438/202, 214, 218, 407; 257/209, 255, 326
See application file for complete search history.

(56) References Cited

U.S. PATENT DOCUMENTS

| 6,815,278 | B1 | 11/2004 | Ieong et al. |
| 6,995,456 | B2 | 2/2006 | Nowak |
| 2004/0195646 | A1 | 10/2004 | Yeo et al. |
| 2006/0024931 | A1 | 2/2006 | Chan et al. |
| 2006/0049460 | A1 | 3/2006 | Chen et al. |
| 2008/0173906 | A1* | 7/2008 | Zhu et al. ............ 257/255 |

OTHER PUBLICATIONS

O. Weber, et al., "A Novel Locally Engineered (111) V-channel pMOSFET Architecture with Improved Drivability Characteristics for Low-Standby power (LSTP) CMOS Applications", 2005 Symposium on VLSI Technology Digest of Technical Papers, pp. 156-157.

* cited by examiner

*Primary Examiner*—N Drew Richards
*Assistant Examiner*—Kyoung Lee
(74) *Attorney, Agent, or Firm*—Joseph Petrokaitis

(57) ABSTRACT

An SOI CMOS structure includes a v-shape trench in a pFet region. The v-shape trench has a surface in a (111) plane and extends into an SOI layer in the pFet region. A layer, such as a gate oxide or high-k material, is formed in the v-shape trench. Poly-Si is deposited on top of the layer.

20 Claims, 6 Drawing Sheets

STRUCTURE AND METHOD FOR MANUFACTURING DEVICE WITH ULTRA THIN SOI AT THE TIP OF A V-SHAPE CHANNEL

BACKGROUND OF THE INVENTION

The present invention relates to a semiconductor device and method of manufacturing the same and, more specifically, to a structure and method for manufacturing a hybrid crystalline orientation complementary metal-oxide-semiconductor (CMOS) with an ultra-thin-silicon-on-insulator (UT-SOI) at the tip of a V-shape channel.

Mobility of electrons or holes depends on surface crystalline orientations in silicon. In a metal-oxide-semiconductor field-effect transistor (MOSFET) with an n-type channel (nMOSFET), electrons are responsible for conduction. In a MOSFET with a p-type channel (pMOSFET), holes are responsible for conduction. It is desirable to build an nMOSFET in a (100) surface and a pMOSFET in a (111) surface in order to obtain the maximum electron mobility for the nMOSFET and the maximum hole mobility for the pMOSFET.

Conventional hybrid-orientation technology (HOT) requires selective epitaxial growth of silicon which can generate dislocations and reduce yield.

UT-SOI has a better short channel effect than partially depleted silicon-on-insulator (SOI) and/or bulk MOSFETs. However, UT-SOI degrades mobility which then reduces device performance.

SUMMARY OF THE INVENTION

In a first aspect of the invention, a method of forming a device includes forming an oxide layer on top of an SOI CMOS structure having an nFet region and a pFet region, wherein a top of the oxide layer is co-planar with a top of the pFet region. The method includes patterning a hardmask nitride layer to cover the oxide layer above the nFet region. The method includes removing poly-Si in the pFet region. The method includes removing gate oxide in the pFet region to expose an SOI layer in a channel area of the pFet region. The method includes removing the hardmask nitride layer above the nFet region. The method includes performing a wet anisotropical etch of the SOI layer in the pFet region to form a v-shape trench having a surface in a (111) plane. The method includes forming a gate oxide in the trench. The method further includes depositing poly-Si on top of the gate oxide. The method also includes removing the oxide layer.

In another aspect of the invention, a method of forming a device includes depositing an oxide layer on top of an SOI CMOS structure having an nFet region and a pFet region. The method includes performing a chemical mechanical polish (CMP) of the oxide layer. The method includes patterning a hardmask nitride layer to cover the oxide layer above the nFet region. The method includes performing a first reactive ion etching (RIE) to remove poly-Si in the pFet region. The method includes performing a second RIE to remove gate oxide in the pFet region and to expose an SOI layer in a channel area of the pFet region. The method includes removing the hardmask nitride layer above the nFet region. The method includes performing a wet anisotropical etch of the SOI layer in the pFet region to form a v-shape trench having a surface in a (111) plane, wherein the v-shape trench has a depth less than the thickness of the SOI layer. The method includes forming a gate oxide in the trench. The method includes depositing in-situ doped poly-Si on top of the gate oxide. The method further includes etching back the in-situ doped poly-Si. The method also includes etching back the oxide layer.

In a further aspect of the invention, a device includes an SOI CMOS structure having an nFet region and a pFet region. The device includes a v-shape trench in the pFet region, the v-shape trench having a surface in a (111) plane and extending into an SOI layer in the pFet region. The device further includes a layer in the v-shape trench. The device also includes poly-Si on top of the layer.

BRIEF DESCRIPTION OF THE DRAWINGS

The present invention is described in the detailed description below, in reference to the accompanying drawings that depict non-limiting examples of exemplary embodiments of the present invention.

DETAILED DESCRIPTION OF THE INVENTION

The invention relates to a semiconductor device and method of manufacturing the same and, more particularly, to a structure and method for manufacturing a device with an UT-SOI at the tip of a V-shape channel.

Figure 1:
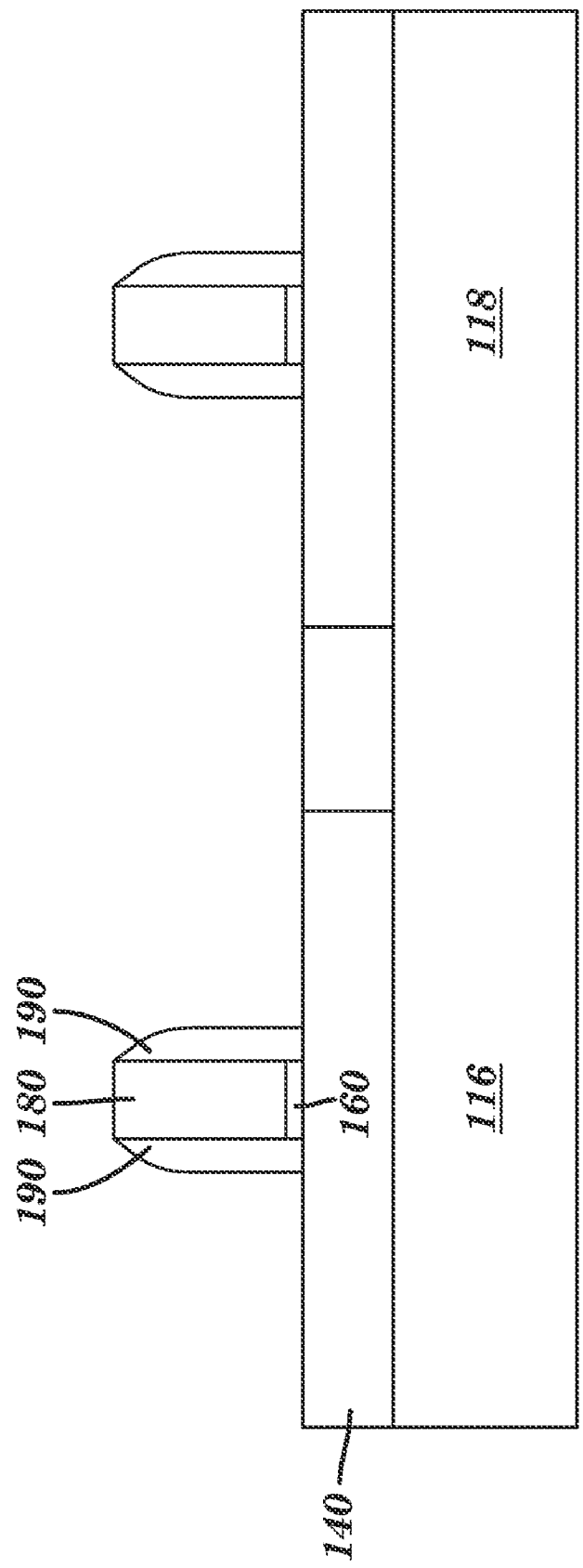
FIG. 1 shows a starting structure and processing steps in accordance with an embodiment of the invention.

FIG. 1 shows a starting structure and processing steps in accordance with an embodiment of the invention. The starting structure is an SOI CMOS structure built on a (100) Si plane by conventional process flow. The structure includes an nFet region 116 and a pFet region 118. Nitride spacers 190 may be formed. Gate oxide 160 may be deposited on top of SOI layer 140. Poly-Si 180 may be deposited on gate oxide 160.

Figure 2:
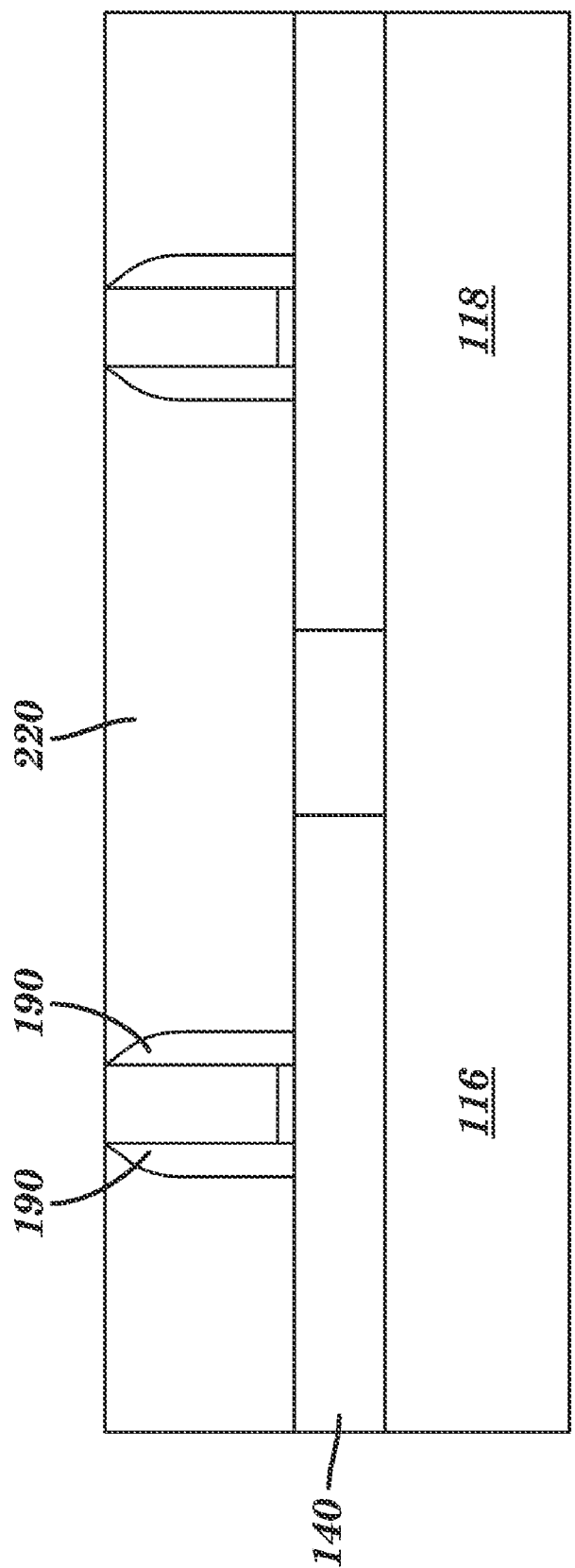
FIGS. 2-5 show processing steps and intermediate structures in accordance with an embodiment of the invention.

Referring to FIG. 2, an oxide layer 220 is deposited on the top of nitride spacer 190 and SOI layer 140. A top of the oxide layer 220 is co-planar with a top of the pFet region. A chemical mechanical polish (CMP) of oxide layer 220 may be performed on the top of nitride spacer 190 to make it co-planar.

Figure 3:
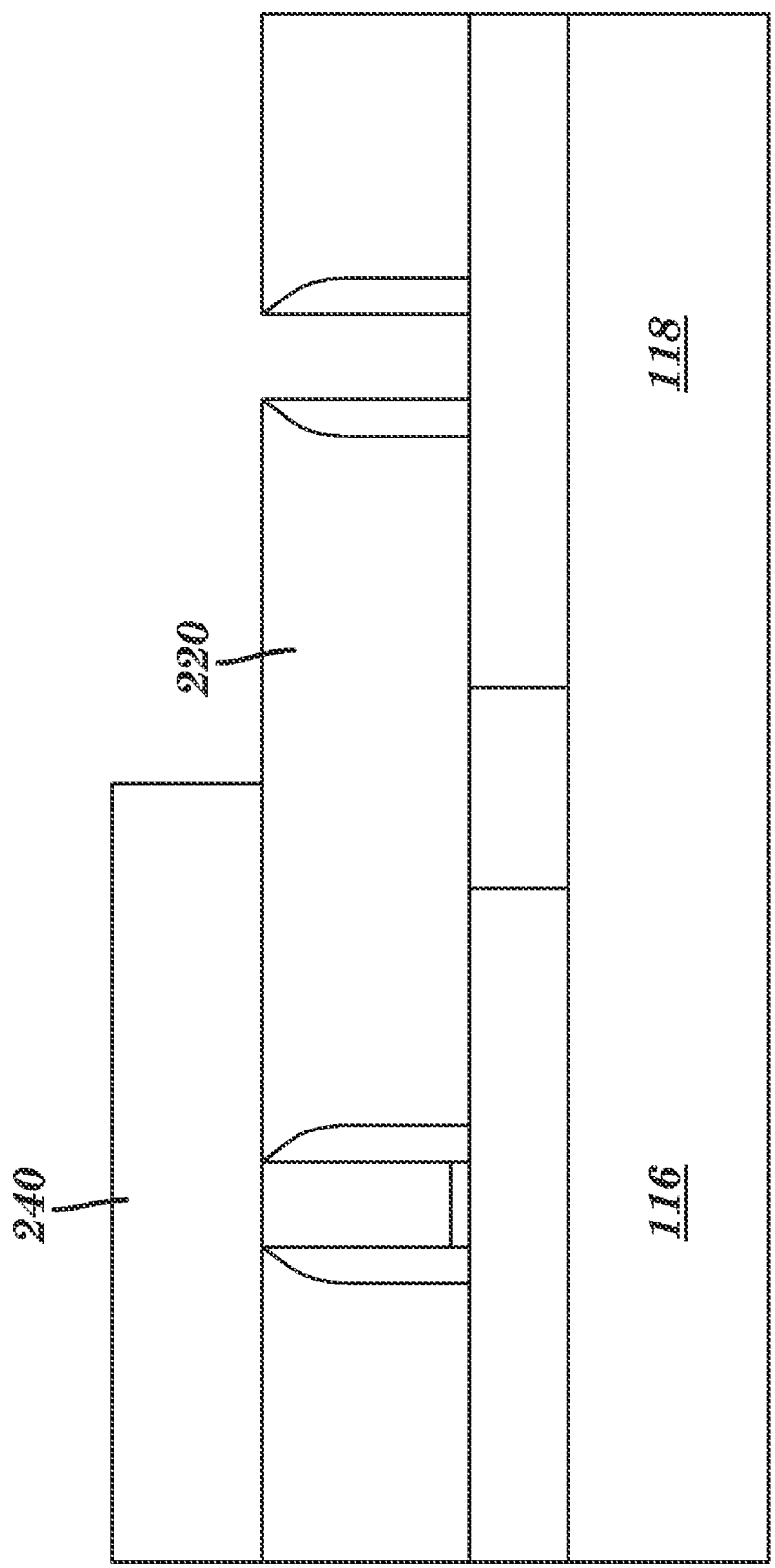

Referring to FIG. 3, a hardmask nitride layer 240 is patterned to cover nFet region 116. Poly-Si 180 is removed in the pFet region. Reactive ion etching (RIE) may be performed to remove poly-Si 180. Gate oxide 160 is removed in the pFet region and to expose an SOI layer in a channel area of the pFet region. RIE may also be performed to remove gate oxide 160 to expose Si in a channel area of pFet region 118.

Figure 4:
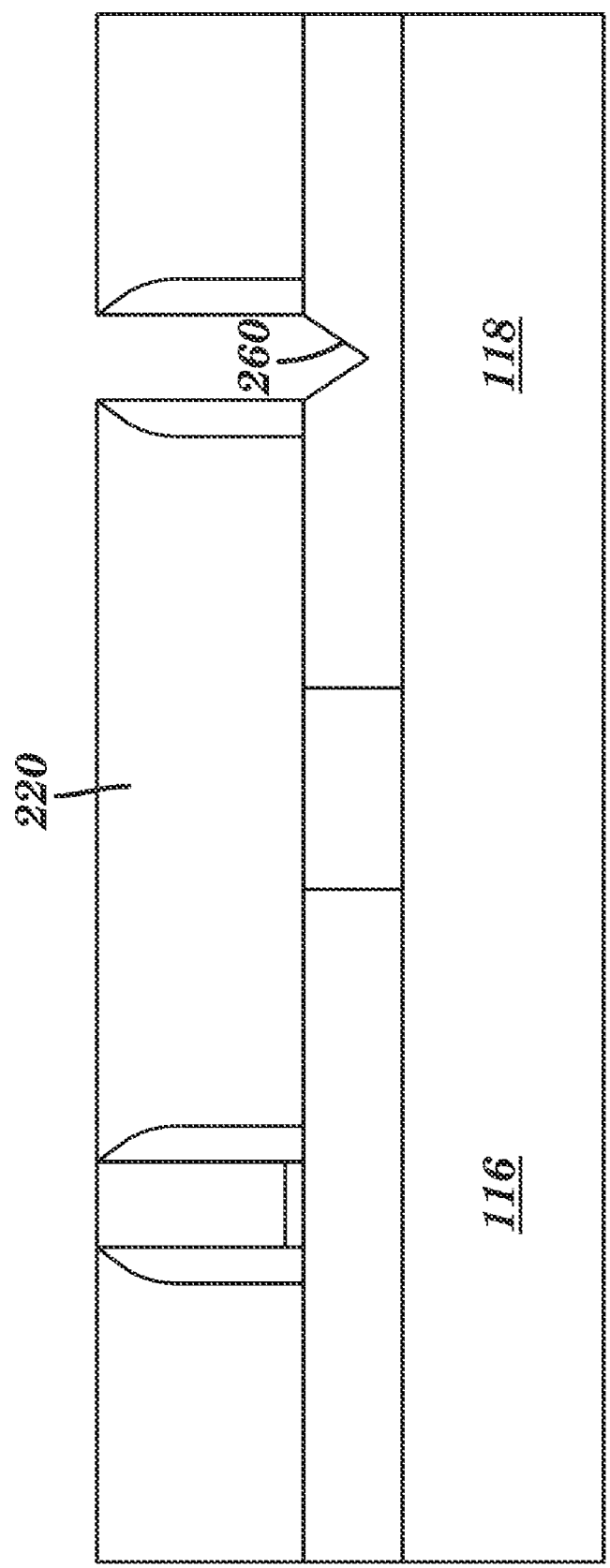

Referring to FIG. 4, a wet anisotropical etch of SOI in pFet region 118 is performed. The wet anisotropical etch may use either dilute ammonia or tetramethyl ammonium hydroxide (TMAH). The etching process results in the formation of V-shape trench 260 having a surface in a (111) plane. V-shape trench 260 has a depth less than the thickness of the SOI layer. The distance between the tip of the V-shape to the bottom of the SOI layer is preferably less than 10 nanometers. The thickness of the SOI layer is preferably greater than 20 nanometers. Hardmask nitride layer 240 is removed using a conventional process.

Figure 5:
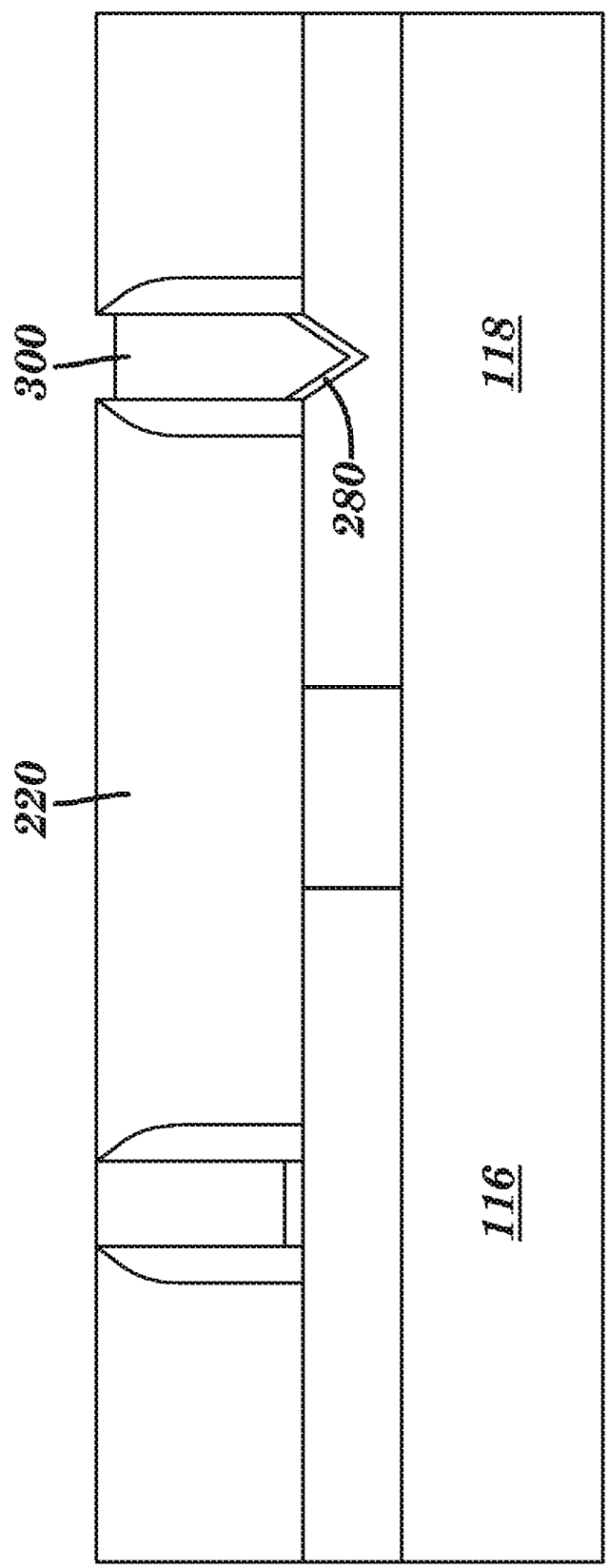

Referring to FIG. 5, a gate oxide 280 may be formed, for example, by thermal oxidation in trench 260. Alternatively, a high-k material can be deposited in order to avoid dopant redistribution during gate oxide formation. Poly-Si 300 is deposited on top of gate oxide 280. Poly-Si 300 may be in-situ doped. Specifically, poly-Si may be doped with in-situ p+ dopant such as B. Alternatively, TiN or WN can be deposited in trench 260.

Poly-Si 300 may be over deposited and extend above oxide layer 220. Poly-Si 300 may be etched back using conventional processes to be co-planar with oxide layer 220.

Figure 6:
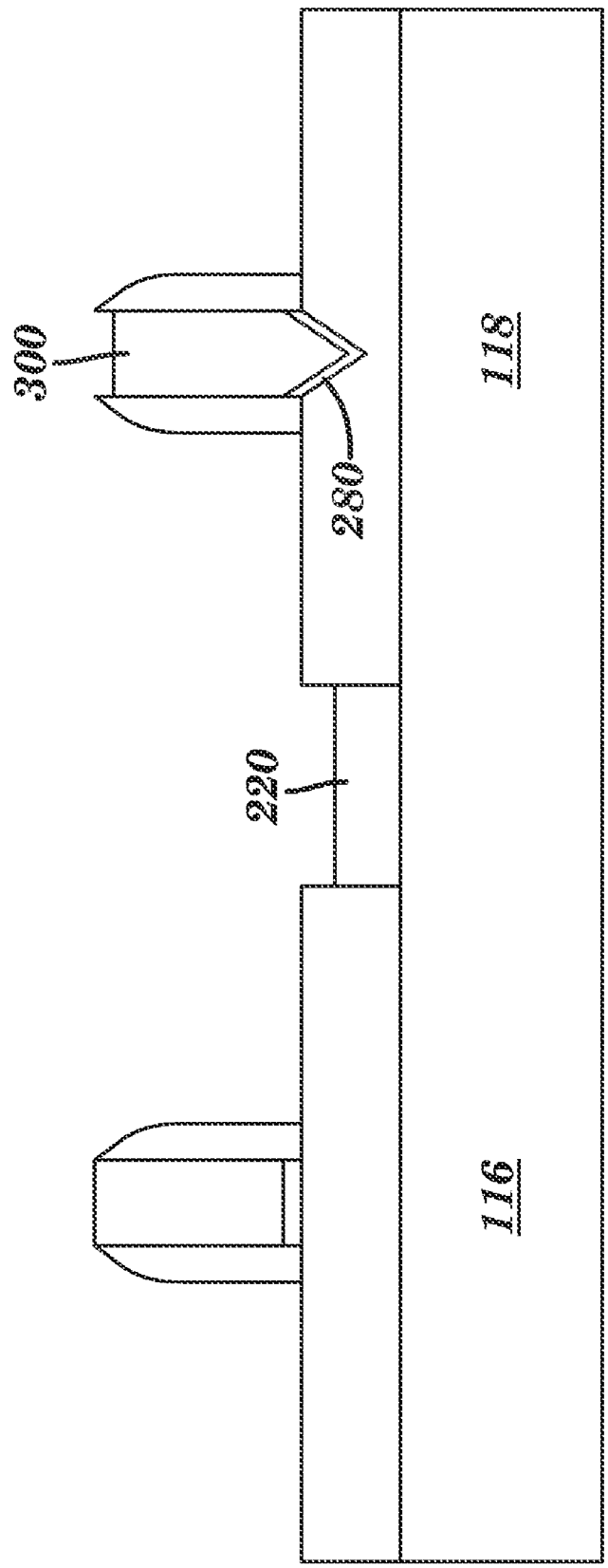
FIG. 6 shows processing steps and a final structure in accordance with an embodiment of the invention.

FIG. 6 shows processing steps and a final structure in accordance with an embodiment of the invention. Oxide layer 220 may be removed. Oxide layer 220 may be etched back using conventional processes selective to Si. After this step, conventional processes can be used to finish the CMOS device. Part of fully depleted channel (under the tip of V-shape in the channel) improves short channel effect (SCE) control. Part of partially depleted channel (close to SD areas) improves mobility.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of forming a device, comprising:
   forming an oxide layer on top of an SOI CMOS structure having an nFet region and a pFet region, wherein a top of the oxide layer is co-planar with a top of the pFet region;
   patterning a hardmask nitride layer to cover the oxide layer above the nFet region;
   removing poly-Si in the pFet region;
   removing gate oxide in the pFet region to expose an SOI layer in a channel area of the pFet region;
   removing the hardmask nitride layer above the nFet region;
   performing a wet anisotropical etch of the SOI layer in the pFet region to form a v-shape trench having a surface in a (111) plane;
   forming a gate oxide in the trench;
   depositing poly-Si on top of the gate oxide; and
   removing the oxide layer.

2. A method according to claim 1, wherein the forming the oxide layer step comprises performing a chemical mechanical polish (CMP) of the oxide layer.

3. A method according to claim 1, wherein the removing the poly-Si step comprises performing a first reactive ion etching (RIE).

4. A method according to claim 1, wherein the removing the gate oxide step comprises performing a second RIE.

5. A method according to claim 1, wherein the performing the wet anisotropical etch comprises using dilute ammonia.

6. A method according to claim 1, wherein the performing the wet anisotropical etch comprises using tetramethyl ammonium hydroxide (TMAH).

7. A method according to claim 1, wherein the gate oxide is a high-k material.

8. A method according to claim 1, wherein the poly-Si is in-situ doped with B.

9. A method according to claim 8, further comprising etching back the in-situ doped poly-Si.

10. A method according to claim 1, wherein the removing the oxide layer step comprises etching back the oxide layer.

11. A method according to claim 1, wherein the v-shape trench has a depth less than the thickness of the SOI layer.

12. A method of forming a device, comprising:
    depositing an oxide layer on top of an SOI CMOS structure having an nFet region and a pFet region;
    performing a chemical mechanical polish (CMP) of the oxide layer;
    patterning a hardmask nitride layer to cover the oxide layer above the nFet region;
    performing a first reactive ion etching (RIE) to remove poly-Si in the pFet region;
    performing a second RIE to remove gate oxide in the pFet region and to expose an SOI layer in a channel area of the pFet region;
    removing the hardmask nitride layer above the nFet region;
    performing a wet anisotropical etch of the SOI layer in the pFet region to form a v-shape trench having a surface in a (111) plane, wherein the v-shape trench has a depth less than the thickness of the SOI layer;
    forming a gate oxide in the trench;
    depositing in-situ doped poly-Si on top of the gate oxide;
    etching back the in-situ doped poly-Si; and
    etching back the oxide layer.

13. A method according to claim 12, wherein the performing the wet anisotropical etch comprises using dilute ammonia.

14. A method according to claim 12, wherein the performing the wet anisotropical etch comprises using tetramethyl ammonium hydroxide (TMAH).

15. A device, comprising:
    an SOI CMOS structure having an nFet region and a pFet region;
    a v-shape trench in the pFet region, the v-shape trench having a surface in a (111) plane and extending into an SOI layer in the pFet region;
    a layer in the v-shape trench; and
    poly-Si on top of the layer.

16. A device according to claim 15, wherein the layer is a gate oxide.

17. A device according to claim 15, wherein the layer is a high-k material.

18. A device according to claim 15, wherein the poly-Si is in-situ doped with B.

19. A device according to claim 15, wherein the v-shape trench has a depth less than the thickness of the SOI layer.

20. A device according to claim 19, wherein the thickness of the SOI layer is greater than 20 nanometers and the distance between the tip of the v-shape and the bottom of the SOI layer is less than 10 nanometers.

* * * * *